(12) United States Patent
Yoshinaga

(10) Patent No.: US 7,839,073 B2
(45) Date of Patent: Nov. 23, 2010

(54) LIGHT-EMITTING DISPLAY APPARATUS INCORPORATING COMBINED FIRST AND SECOND AUXILIARY ELECTRODES ARRANGED AT INTERVALS AND METHOD OF PRODUCING THE SAME

(75) Inventor: Hideki Yoshinaga, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 278 days.

(21) Appl. No.: 12/238,124

(22) Filed: Sep. 25, 2008

(65) Prior Publication Data
US 2009/0091257 A1  Apr. 9, 2009

(30) Foreign Application Priority Data
Oct. 9, 2007  (JP) .............................. 2007-263016

(51) Int. Cl.
*H01L 51/50* (2006.01)
*H01L 51/52* (2006.01)
*H01L 51/56* (2006.01)

(52) U.S. Cl. ...................... 313/503; 313/506; 313/504; 445/24; 445/25; 427/66

(58) Field of Classification Search ......... 313/500–512; 445/24, 25; 427/66
See application file for complete search history.

(56) References Cited

U.S. PATENT DOCUMENTS

| 7,580,014 | B2 * | 8/2009 | Tanaka et al. ................... 345/76 |
| 2002/0158835 | A1 | 10/2002 | Kobayashi et al. ........... 345/100 |
| 2003/0038591 | A1 * | 2/2003 | Kim ........................... 313/504 |
| 2007/0132368 | A1 | 6/2007 | Kuwahara et al. ............ 313/503 |

FOREIGN PATENT DOCUMENTS

| JP | 2002-318556 | 10/2002 |
| JP | 2003-316291 | 11/2003 |
| JP | 2007-92109 | 4/2007 |
| JP | 2007-157662 | 6/2007 |

* cited by examiner

*Primary Examiner*—Mariceli Santiago
(74) *Attorney, Agent, or Firm*—Fitzpatrick, Cella, Harper & Scinto

(57) ABSTRACT

A display apparatus includes a display substrate having an element isolation film surrounding peripheral edges of a plurality of first electrodes, and a laminated area composed of a second electrode and auxiliary electrodes and disposed on the element isolation film. Each of the auxiliary electrode is composed of first auxiliary electrodes arranged in a broken line pattern, and second auxiliary electrodes provided on the first auxiliary electrodes so as to cover areas where the first auxiliary electrodes are not provided. A wiring interval between auxiliary electrodes is smaller than a wiring length of an auxiliary electrode, and the film thickness of each of the first auxiliary electrodes is in the range of 5 to 30 nm.

3 Claims, 7 Drawing Sheets

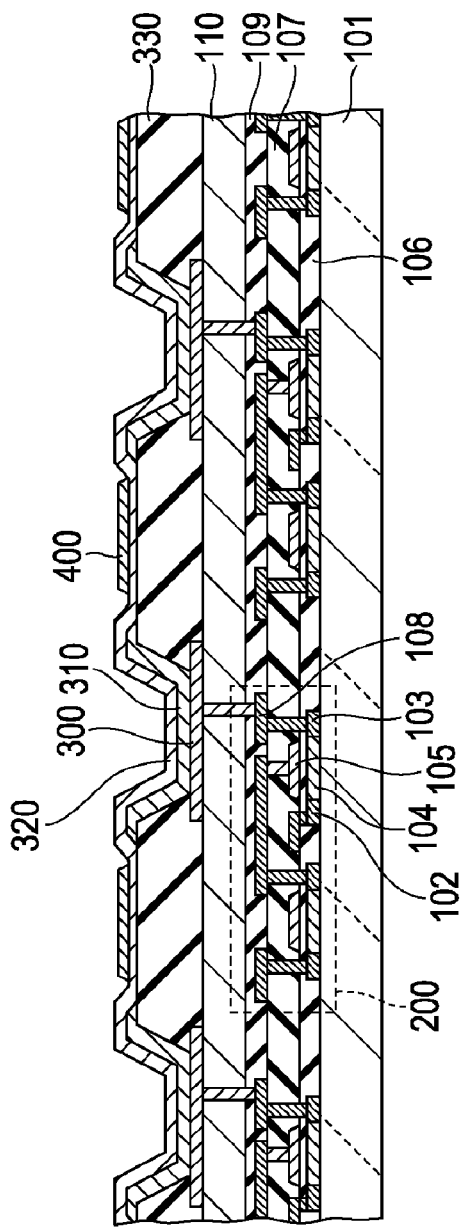
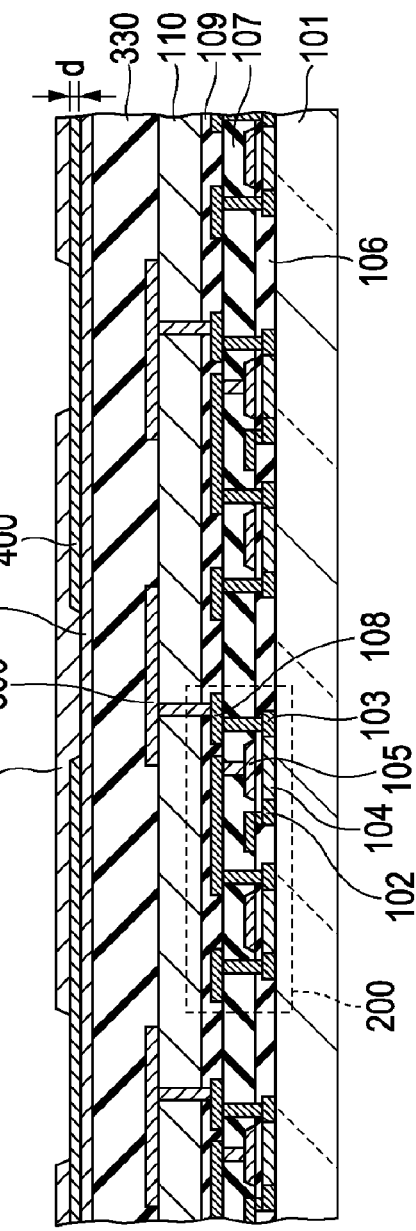
FIG. 7A
FIG. 7B

LIGHT-EMITTING DISPLAY APPARATUS INCORPORATING COMBINED FIRST AND SECOND AUXILIARY ELECTRODES ARRANGED AT INTERVALS AND METHOD OF PRODUCING THE SAME

BACKGROUND OF THE INVENTION

1. Field of the Invention

The present invention relates to a display apparatus including light-emitting elements and a method of producing the same.

2. Description of the Related Art

An organic electroluminescent element utilizing electroluminescence (hereinafter referred to as "EL") of an organic material includes a first electrode and a second electrode disposed so as to face each other, and an organic layer disposed between the electrodes. Such an organic EL element has attracted attention as a light-emitting element that can realize high-luminance light emission by low-voltage driving.

An active matrix display apparatus (organic EL display) utilizing such an organic EL element includes thin-film transistors (hereinafter referred to as "TFTs") corresponding to respective pixels on a substrate. Organic EL elements are arranged on an interlayer insulating film provided so as to cover the TFTs. Each of the organic EL elements includes a first electrode connected to a TFT and formed by patterning on the pixel, and an insulating element isolation film covering the periphery of the first electrode so as to leave the central portion of the first electrode exposed as a pixel opening. Each of the organic EL elements further includes an organic layer provided on the first electrode in the pixel opening, which is defined by the element isolation film, and a second electrode covering the organic layer. Among these, the second electrode is generally formed so as to cover a plurality of pixels and is used for the plurality of pixels in common.

In such an active matrix display apparatus, in order to ensure that a sufficient light-emitting area (aperture ratio) is provided in a single pixel area of the organic EL element, a top-face light extraction structure in which light is extracted from the top surface side of a substrate is effective. Accordingly, it is desired that the thickness of the second electrode be reduced in order to achieve sufficient light transmissivity. In such a case, the resistance of the second electrode increases, and thus voltage drop tends to readily occur.

To solve this problem, a structure has been suggested in which the voltage drop of such a second electrode is prevented by forming an auxiliary electrode made of a metal having satisfactory electrical conductivity on an element isolation film disposed between pixel openings to bring the auxiliary electrode into electrical contact with the second electrode.

As such a light-emitting apparatus, Japanese Patent Laid-Open No. 2002-318556 discloses a structure in which an auxiliary electrode is formed in the same layer as a first electrode, an organic layer is independently formed on each first electrode, and a second electrode is then formed so as to be in contact with the auxiliary electrode.

Furthermore, Japanese Patent Laid-Open Nos. 2003-316291 and 2007-92109 disclose methods in which a second electrode is formed, and auxiliary electrodes are then formed on the second electrode by vapor deposition using a shadow mask.

As described above, in the top-face light extraction structure, which is effective in an active matrix display apparatus, it is essential to increase the light transmittance of a second electrode, which is disposed on the light extraction side. In addition, in view of the effect of optical absorption loss and interference, it is necessary to form a thin second electrode. Consequently, the voltage may become nonuniform due to the in-plane resistance of the second electrode on the light extraction side, thereby degrading the display quality due to a decrease in the response speed, an increase in the electric power consumption, or the like.

To overcome this problem and to decrease the resistance of a second electrode, formation of an auxiliary electrode that is electrically connected to the second electrode has been proposed. However, in the structure disclosed in Japanese Patent Laid-Open No. 2002-318556, the auxiliary electrode is formed in the same layer as the first electrode, and thus the area of the first electrode is decreased by the area corresponding to the auxiliary wiring.

In addition, after the formation of an organic layer, it is necessary to bring the second electrode into contact with the auxiliary electrode, which is provided in the same layer as the first electrode. Therefore, it is necessary for a common layer contained in the organic layer to be aligned with high accuracy, the common layer being provided in common for each of colors, so that the common layer is not deposited on the auxiliary electrode. Accordingly, the structure of the apparatus may become complex.

As described in Japanese Patent Laid-Open No. 2003-316291, in the structure in which an auxiliary electrode is formed on an element isolation film to be in contact with a second electrode, the auxiliary electrode is formed by vapor deposition using a shadow mask in a direction of a long side of a pixel so as to extend to the outside of an image display unit on the element isolation film. Accordingly, the width of the auxiliary electrode may vary because of twisting and bending of the shadow mask in the direction of a long side of a pixel, and thus the production yield may be decreased. This phenomenon becomes more significant as the size of the screen of the display apparatus increases. As a result, it becomes difficult to arrange the auxiliary electrode in a non-light-emitting area.

To overcome this problem, according to the technique described in Japanese Patent Laid-Open No. 2007-92109, in order to maintain the strength of a shadow mask, a wiring pattern of the shadow mask is a broken line pattern having a selection ratio of 50%. Accordingly, auxiliary electrodes can be formed while preventing, for example, twisting of the shadow mask.

In this technique, however, after the auxiliary electrode formation is performed once, auxiliary electrodes are arranged in a broken line pattern. Therefore, vapor deposition must be performed again on areas where the auxiliary electrodes are not provided so that a film deposited in this step has the same thickness as the auxiliary electrodes formed above. In this case, a first alignment mark for forming first auxiliary electrodes and a second alignment mark for forming second auxiliary electrodes are provided in advance on the substrate side. After the formation of the first auxiliary electrodes, the shadow mask is shifted, and alignment is performed again using the second alignment mark.

After the formation of the first auxiliary electrodes by vapor deposition is completed at a first alignment position, the vapor deposition is performed on an area including an opening used for alignment of the shadow mask. Therefore, it is necessary that the second alignment mark be located in an area that is sufficiently distant from the first alignment mark.

For example, in the case where the position of the first alignment mark and the position of the second alignment mark are located within an area smaller than the opening used for alignment of the shadow mask, after the formation of the first auxiliary electrodes, the alignment mark used for forming the second auxiliary electrodes cannot be seen.

When the alignment marks provided on the substrate side are distant from each other by, for example, about 10 mm, it is necessary to shift the shadow mask by about 10 mm, accordingly.

That is, after alignment is performed in the formation of the first auxiliary electrodes, the shadow mask is shifted to the alignment position for forming the second auxiliary electrodes. Subsequently, alignment is again performed in order to form the second auxiliary electrodes. Accordingly, the process of forming the auxiliary electrodes is complex.

SUMMARY OF THE INVENTION

The present invention has been proposed in view of the above-described situation and provides a display apparatus having auxiliary electrodes for which a high definition and a high yield can be realized.

A display apparatus and a method of producing the display apparatus of the present invention have the following features.

A display apparatus of the invention includes a substrate; a plurality of light-emitting elements disposed on the substrate, the light-emitting elements including a plurality of first electrodes, each of which is independently disposed on the substrate, a plurality of light-emitting layers, wherein a light-emitting layer is disposed on each of the first electrodes, and a light-transmissive second electrode which is continuously disposed over the light-emitting layers so as to cover the plurality of light-emitting elements; and auxiliary electrodes which are disposed on the second electrode and which are linearly arranged between adjacent light-emitting elements, each of the auxiliary electrodes including first auxiliary electrodes which are intermittently arranged at intervals and which have a thickness in the range of 5 to 30 nm, and second auxiliary electrodes which cover edges of the first auxiliary electrodes and which are intermittently arranged at the same intervals as the first auxiliary electrodes.

A method of the present invention for producing a display apparatus which apparatus includes a substrate; a plurality of light-emitting elements disposed on the substrate, the light-emitting elements including a plurality of first electrodes, each of which is independently disposed on the substrate, a plurality of light-emitting layers, wherein a light-emitting layer is disposed on each of the first electrodes, and a light-transmissive second electrode which is continuously disposed over the light-emitting layers so as to cover the plurality of light-emitting elements; and auxiliary electrodes which are disposed on the second electrode and which are linearly arranged between adjacent light-emitting elements, the method comprising the steps of aligning the substrate with a shadow mask to form an aligned state by aligning an alignment mark provided on the substrate with an opening provided on the shadow mask; forming first auxiliary electrodes intermittently at intervals in the aligned state; aligning the alignment mark on which a layer comprising the first auxiliary electrodes is formed with the opening, and then shifting the shadow mask by a predetermined distance; and forming second auxiliary electrodes intermittently so as to cover edges of the first auxiliary electrodes.

Specifically, in a display apparatus of the present invention, pixels are composed of a plurality of first electrodes which are formed by patterning so as to correspond to the pixels on a substrate, a luminescent medium containing a light-emitting material and disposed so as to correspond to each of the first electrodes, and a second electrode disposed so as to face the first electrodes. In addition, the display apparatus of the present invention includes a display substrate having an electrically insulating partition surrounding peripheral edges of each of the first electrodes, and a laminated area disposed on the electrically insulating partition and composed of the second electrode and auxiliary electrodes. Each of the auxiliary electrodes is composed of first auxiliary electrodes arranged in a broken line pattern, and second auxiliary electrodes provided on the first auxiliary electrodes so as to cover areas where the first auxiliary electrodes are not provided. Furthermore, formulae (1) and (2) below are satisfied:

$$b<c \tag{1}$$

$$5\ \text{nm} \leq d \leq 30\ \text{nm} \tag{2}$$

wherein b represents a wiring interval between auxiliary electrodes, c represents a wiring length of an auxiliary electrode, and d represents a film thickness of a first auxiliary electrode.

According to a method of producing a display apparatus of the present invention, in producing the above-described display apparatus, the first auxiliary electrodes and the second auxiliary electrodes are formed by a vapor deposition process using a shadow mask.

According to the display apparatus of the present invention, since the film thickness of each the first auxiliary electrodes is small, the position of an alignment mark for a shadow mask disposed on an organic EL substrate can be confirmed even after the first auxiliary electrodes are formed using the shadow mask. Accordingly, by shifting the shadow mask in a direction parallel to the resulting auxiliary wiring after the completion of the alignment step using an alignment mark, another auxiliary wiring can be formed using the same shadow mask. As a result, continuous auxiliary wiring can be formed while ensuring the strength of the shadow mask and any increase in the process time due to a performance of a vapor deposition process a plurality of times, can be minimized.

Further features of the present invention will become apparent from the following description of exemplary embodiments with reference to the attached drawings.

BRIEF DESCRIPTION OF THE DRAWINGS

FIGS. 7A and 7B are cross-sectional views showing steps of the process of producing the organic EL element in the display apparatus according to the Example of the present invention.

DESCRIPTION OF THE EMBODIMENTS

A display apparatus and a method of producing the display apparatus according to embodiments of the present invention will now be described with reference to the drawings. A display apparatus and a method of producing the display apparatus of the present invention are not limited to the embodiments described below.

Display Apparatus

Figure 1:
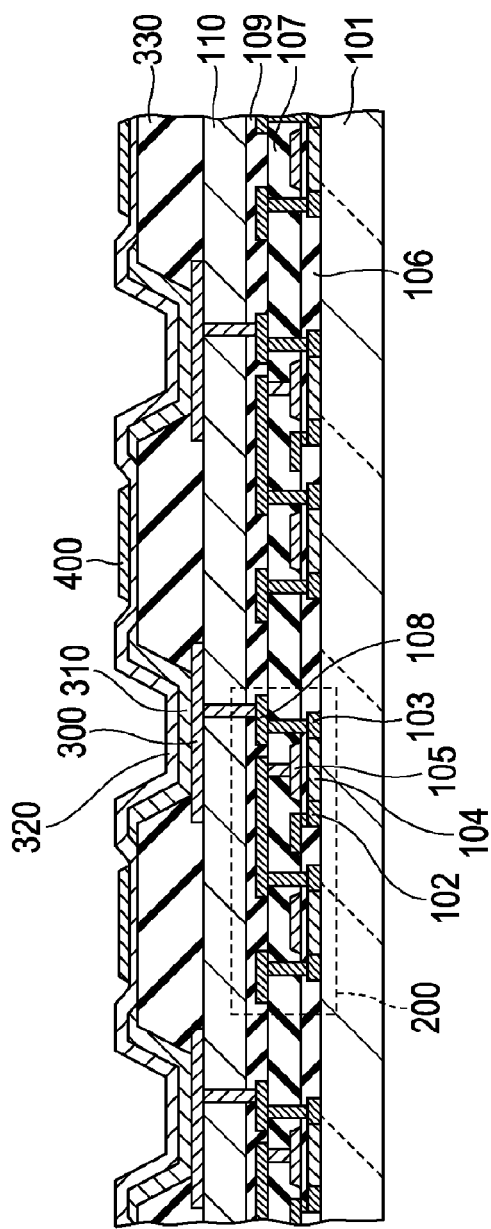
FIG. 1 is a cross-sectional view showing the schematic structure of a display area in a display apparatus according to an embodiment of the present invention.
Figure 2:
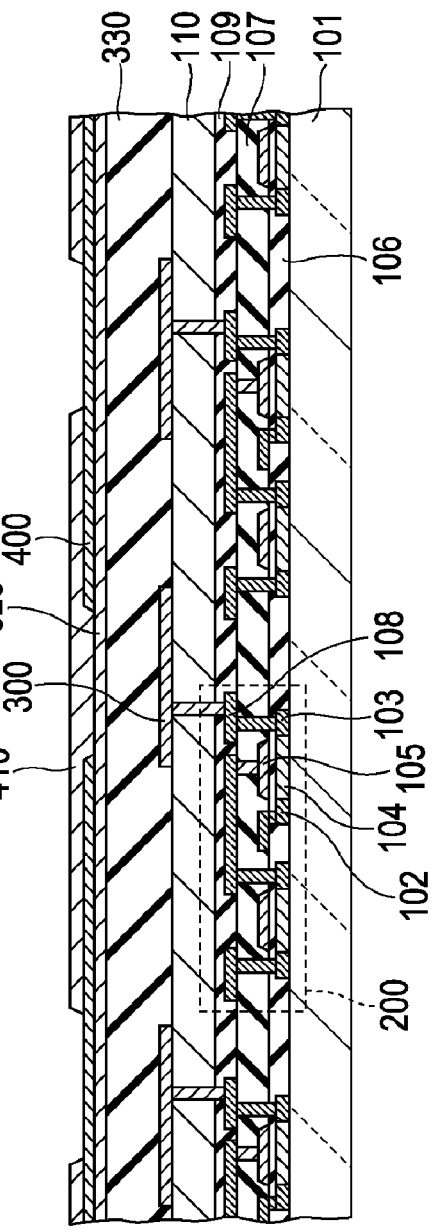
FIG. 2 is a cross-sectional view showing the schematic structure of the display area in the display apparatus according to the embodiment of the present invention.
Figure 3:
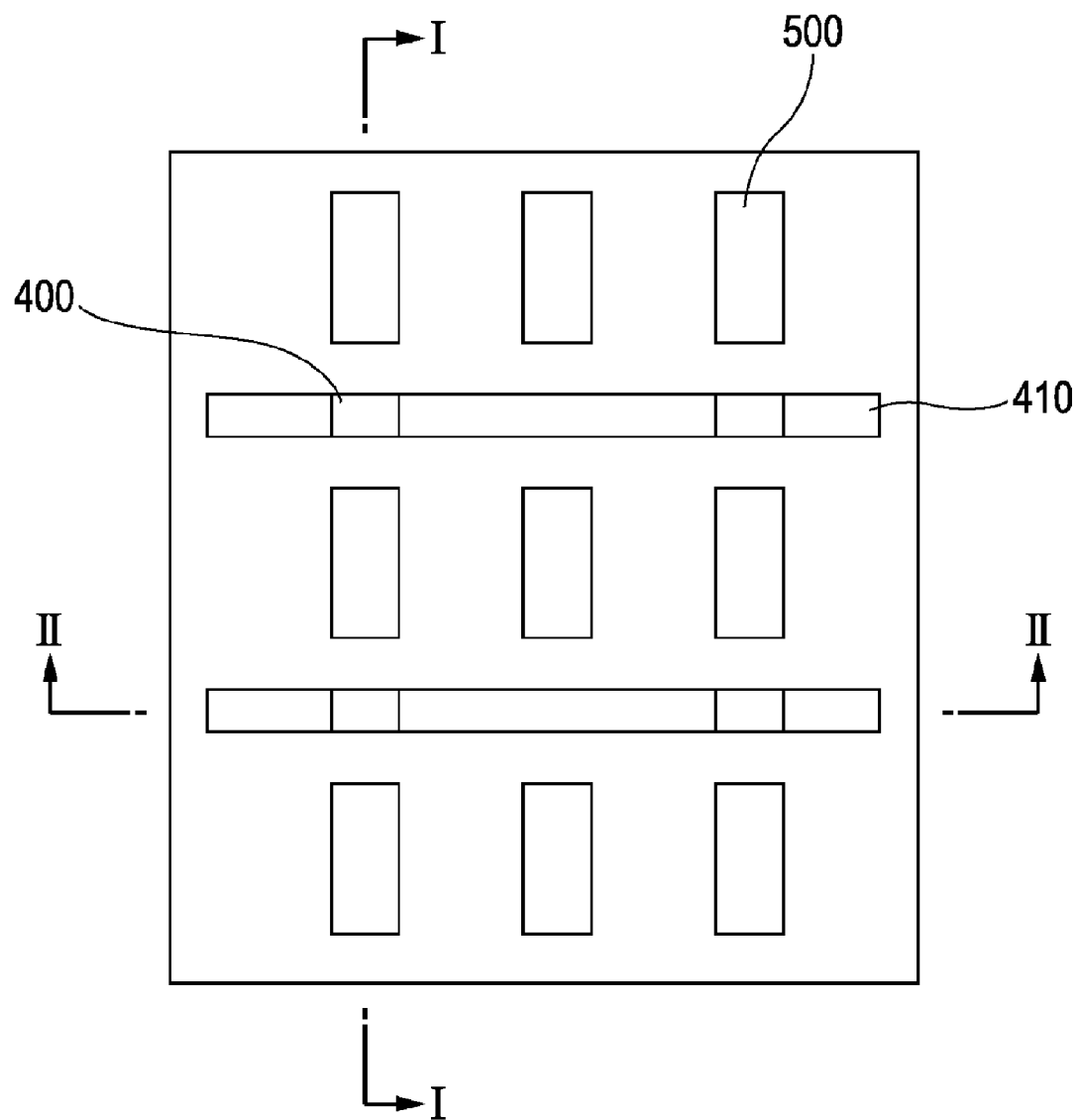
FIG. 3 is a plan view showing the schematic structure of the display area in the display apparatus according to the embodiment of the present invention.

FIG. 3 is a plan view showing the schematic structure of a display area in a display apparatus according to an embodiment of the present invention. FIG. 1 is a cross-sectional view taken along line I-I in FIG. 3, and FIG. 2 is a cross-sectional view taken along line II-II in FIG. 3.

The display apparatus according to this embodiment of the present invention includes an active matrix display substrate on which organic EL elements are arranged as light-emitting elements. In FIGS. 1 to 3, reference numeral 101 indicates a substrate, reference numeral 102 indicates a source region, reference numeral 103 indicates a drain region, reference numeral 104 indicates poly-Si, and reference numeral 105 indicates a gate electrode. Reference numeral 106 indicates an insulating film (gate insulating film), reference numeral 107 indicates an insulating film (interlayer insulating film), reference numeral 108 indicates a drain electrode, reference numeral 109 indicates an insulating film (inorganic insulating film), and reference numeral 110 indicates a planarizing film. In addition, reference numeral 200 indicates a TFT, reference numeral 300 indicates a first electrode that is formed as a pattern, reference numeral 310 indicates a light-emitting material layer which is a luminescent medium, reference numeral 320 indicates a second electrode provided so as to face the first electrode 300, and reference numeral 330 indicates an element isolation film functioning as an electrically insulating partition. Furthermore, reference numeral 400 indicates a first auxiliary electrode, reference numeral 410 indicates a second auxiliary electrode, and reference numeral 500 indicates a pixel.

As shown in FIGS. 1 to 3, each of the pixels provided on the substrate 101 includes a TFT 200. The source region 102 of the TFT 200, and the drain electrode 108 connected to the drain region 103 of the TFT 200 are provided on the substrate 101 having the TFT 200 thereon. The insulating films 106, 107, and 109 and the planarizing film 110 are provided so as to enclose the drain electrode 108. The TFT 200 is not limited to a top-gate-type TFT, which is shown in the figures. Alternatively, the TFT 200 may be a bottom-gate-type TFT.

The first electrode 300 formed by patterning, the light-emitting material layer 310 which is a luminescent medium, and the second electrode 320 disposed so as to face the first electrode 300 are laminated on each pixel opening surrounded by the element isolation film 330 disposed on the planarizing film 110.

When the first electrode 300 is used as a negative electrode and the second electrode 320 is used as a positive electrode, the first electrode 300 is formed using an alloy of an element of Group I or Group II of the periodic table or a compound thereof. More specifically, the first electrode 300 may be composed of a reflective electrode made of aluminum, silver, or an alloy of aluminum or neodymium. Alternatively, the first electrode 300 may be composed of a composite layer in which indium tin oxide, zinc oxide, gallium-containing zinc oxide, or a compound thereof is provided on the above-mentioned reflective electrode.

The second electrode 320 is made of indium tin oxide, zinc oxide, gallium-containing zinc oxide, or a compound thereof. In order to satisfactorily bring the second electrode 320 into contact with the light-emitting material layer 310 which is a luminescent medium, a metal layer having a small thickness may be provided between the second electrode 320 and the light-emitting material layer 310.

When the first electrode 300 is used as a positive electrode and the second electrode 320 is used as a negative electrode, the first electrode 300 is formed using indium tin oxide, zinc oxide, gallium-containing zinc oxide, or a compound thereof, or an electroconductive material having a work function close to that of these substances. Alternatively, the first electrode 300 can be formed using an alloy of an element of Group I or Group II of the periodic table or a compound thereof. For example, the first electrode 300 may be may be composed of a composite layer in which indium tin oxide, zinc oxide, gallium-containing zinc oxide, or a compound thereof is provided on a reflective electrode made of aluminum, silver, an alloy of aluminum or neodymium.

The second electrode 320 is made of an alloy of an element of Group I or Group II of the periodic table or a compound thereof. The second electrode 320 can be made of an alloy of aluminum or silver. Such a metal material layer having a very small thickness may be formed so as to have light transmissivity, and a transparent electroconductive film made of, for example, indium tin oxide may then be formed thereon.

Furthermore, an electroconductive oxide layer may be formed as an adhesion layer between the metal material layer and the planarizing film 110 serving as an underlayer. Thus, the second electrode 320 may have a three-layer structure in which the metal material layer is sandwiched between electroconductive oxide layers.

The element isolation film 330 is an insulating film functioning as an electrically insulating partition provided between adjacent pixels. The element isolation film 330 is arranged so as to cover peripheral edges of the first electrode 300. The element isolation film 330 may be composed of an inorganic insulating film made of silicon nitride, silicon oxynitride, silicon oxide, or the like; or an organic insulating film made of an acrylic resin, a polyimide resin, a novolac resin, or the like.

The light-emitting material layer 310 has a structure in which, for example, a hole injecting/transporting layer that is disposed at the positive electrode side, an electron injecting/transporting layer that is disposed at the negative electrode side, and a light-emitting layer are appropriately combined. For the hole injecting/transporting layer or the electron injecting/transporting layer, a material having excellent injection efficiency of holes or electrons emitted from an electrode and a material having excellent transportation performance (mobility) can be used in combination.

The light-emitting material layer 310 is composed of, for example, three sublayers, namely, a hole-transporting layer, a light-emitting layer, and an electron-transporting layer, but may be composed of only a light-emitting layer. Alternatively, the light-emitting material layer 310 may be composed of two sublayers, four sublayers, or the like. For example, the hole-transporting layer is made of NPD, but the material of the hole-transporting layer is not limited thereto.

The light-emitting material layer 310 is provided for each luminescent color, and areas for different colors are separated by a shadow mask. For the light-emitting material layer 310, for example, a layer made of CBP doped with Ir(piq)$_3$ is used as a red-light-emitting layer, a layer made of Alq$_3$ doped with coumarin is used as a green-light-emitting layer, and a layer made of B—Alq$_3$ doped with perylene is used as a blue-light-emitting layer. Other materials may be used as the light-emitting material layer 310. The electron-transporting layer is made of, for example, bathophenanthroline, but the material of the electron-transporting layer is not limited thereto.

The auxiliary electrodes are composed of first auxiliary electrodes 400 formed as a first layer, and second auxiliary electrodes 410 formed as a second layer. A laminated area composed of the second electrode 320 and the auxiliary electrodes (including the first auxiliary electrodes 400 and the second auxiliary electrodes 410) is disposed on the element isolation film 330, which functions as an electrically insulating partition.

The auxiliary electrode is composed of the first auxiliary electrodes 400 arranged in a broken line pattern, and the second auxiliary electrodes 410 provided on the first auxiliary electrodes 400 so as to cover areas where the first auxiliary electrodes 400 are not provided. In the description below, when the term "auxiliary electrodes" is used, it means both the first auxiliary electrodes 400 and the second auxiliary electrodes 410.

Figure 4A:
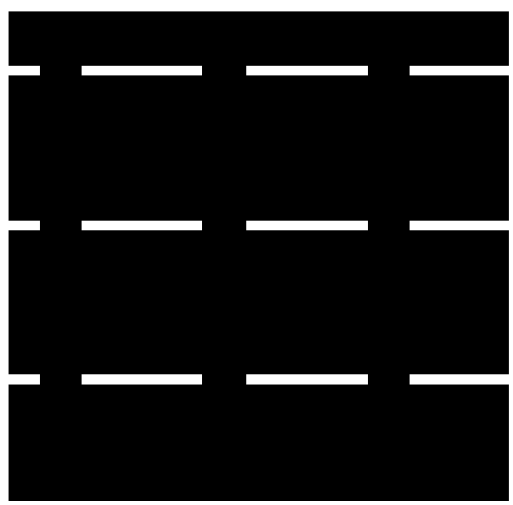
FIGS. 4A, 4B, and 4D are plan views showing the schematic structure of a shadow mask used for forming auxiliary electrodes in the display apparatus according to the embodiment of the present invention.
Figure 4B:
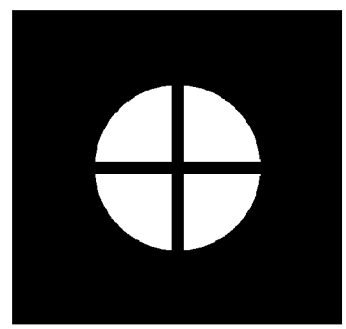
Figure 4C:
FIG. 4C is a plan view showing an alignment mark provided on an organic EL substrate side.
Figure 4D:
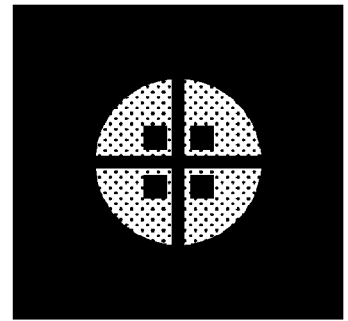

FIGS. 4A, 4B, and 4D are plan views showing the schematic structure of a shadow mask used for forming auxiliary electrodes in a display apparatus according to an embodiment of the present invention. FIG. 4A is a schematic plan view of (a part of) a shadow mask used for forming auxiliary electrodes formed as a first layer (first auxiliary electrodes 400) and auxiliary electrodes formed as a second layer (second auxiliary electrodes 410). FIG. 4B schematically shows an alignment mark portion of the shadow mask, the mark portion being arranged at the periphery of the shadow mask. Furthermore, FIG. 4C schematically shows an alignment mark provided on the organic EL substrate side.

The first auxiliary electrodes 400 formed as the first layer are formed as follows. After the shadow mask is aligned as shown in FIG. 4D using the alignment marks shown in FIGS. 4B and 4C, the first auxiliary electrodes 400 are formed in a broken line pattern in a vapor deposition process. An electroconductive material having a low electrical resistivity is selected as the electrode material. Examples of the electrode material include aluminum, copper, and silver.

It is necessary that the first auxiliary electrodes 400 function as wiring when they are arranged on an organic EL substrate having irregularities thereon. Therefore, each of the first auxiliary electrodes 400 has a thickness of 5 nm or more.

When the second auxiliary electrodes 410 are formed, it is necessary to perform an alignment step again, as shown in FIG. 4D. Therefore, it is necessary to ensure that the alignment mark on the organic EL substrate side shown in FIG. 4C can be confirmed through the openings of the alignment mark portion of the shadow mask shown in FIG. 4B. Therefore, each of the first auxiliary electrodes 400 has a thickness of 30 nm or less.

Accordingly, after the formation of the first auxiliary electrodes 400, alignment can be performed again using the alignment mark for the first auxiliary electrodes 400 arranged on a substrate 101.

In the formation of the second auxiliary electrodes 410 described below, first an alignment is performed using the alignment mark used in the formation of the first auxiliary electrodes 400. Next, the shadow mask is then shifted in a direction parallel to the first auxiliary electrodes 400 by about 20 to 30 micrometers by automatic control so as to cover spaces between wiring portions composed of the first auxiliary electrodes 400 formed in a broken line pattern.

An electroconductive material that has a low resistivity and that establishes a satisfactory ohmic contact with the electroconductive material constituting the first auxiliary electrodes 400 is selected as the material of the second auxiliary electrodes 410. Specifically, the second auxiliary electrodes 410 can be made of aluminum, aluminum and titanium, copper, silver or the like.

In the display apparatus according to this embodiment of the present invention, in order to cover spaces between wiring portions composed of the first auxiliary electrodes 400 formed in a broken line pattern, alignment is performed using the alignment marks shown in FIGS. 4B and 4C. Subsequently, the shadow mask is shifted in a direction parallel to the direction in which the auxiliary electrodes (wiring portions) extend, and deposition is then started again. Therefore, the wiring material used for the second auxiliary electrodes 410 may be the same as the material of the first auxiliary electrodes 400.

The amount of parallel shift of the shadow mask is an amount required for covering the spaces between wiring portions composed of the first auxiliary electrode 400, and the shadow mask is shifted so as to form an area having a laminated structure composed of a first auxiliary electrode 400 and a second auxiliary electrode 410. For this reason, the first auxiliary electrodes 400 and the second auxiliary electrodes 410 are formed using the same shadow mask.

Figure 8:
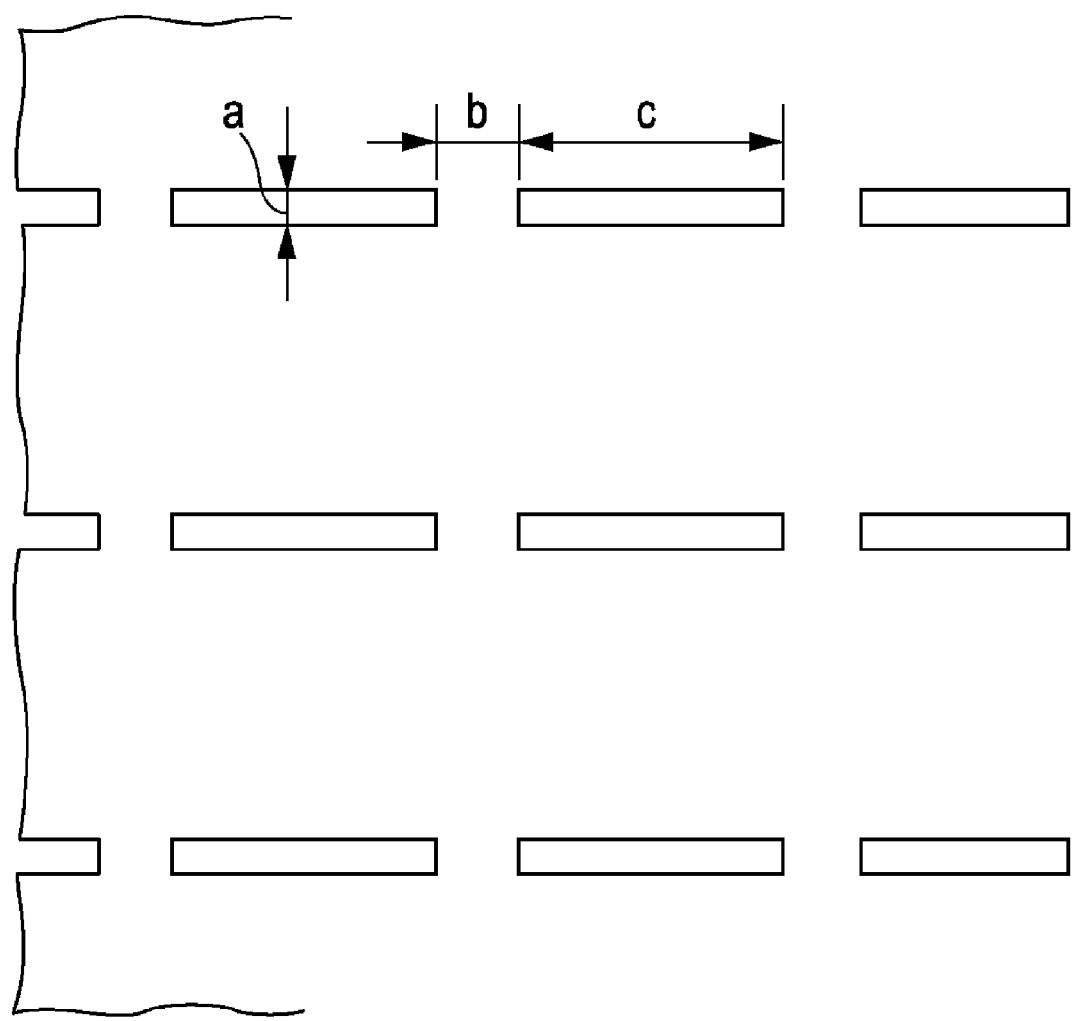
FIG. 8 is a plan view showing the schematic structure of a display area in a display apparatus according to an embodiment of the present invention.

Here, relationships of a wiring width of an auxiliary electrode, a wiring interval between auxiliary electrodes, a wiring length of an auxiliary electrode, and a film thickness of a first auxiliary electrode will now be described with reference to FIG. 8. FIG. 8 is a plan view showing the schematic structure of a display area in a display apparatus according to an embodiment of the present invention. In FIG. 8, a represents a wiring width of each auxiliary electrode, b represents a wiring interval between auxiliary electrodes, and c represents a wiring length of each auxiliary electrode. In addition, d represents a film thickness of a first auxiliary electrode as shown in FIG. 7B.

In the display apparatus according to this embodiment of the present invention, regarding auxiliary electrodes, which are formed in a broken line pattern using a shadow mask, it is necessary that the wiring interval b, the wiring length c, and the film thickness d of the first auxiliary electrode satisfy formulae (1) and (2) below:

$$b < c \qquad (1)$$

$$5 \text{ nm} \leq d \leq 30 \text{ nm} \qquad (2)$$

Furthermore, the wiring width a and the wiring interval b may satisfy formula (3) below:

$$10a \geq b \qquad (3)$$

If the wiring interval b between auxiliary electrodes is excessively large, the wiring resistance of an area where only the first auxiliary electrode 400, which is composed of a thin film, and the second electrode 320 are provided is increased. As a result, an effect achieved by the presence of each auxiliary electrode deceases.

The display apparatus according to this embodiment of the present invention satisfies formula (3) specifying the relationship between the wiring width a of each auxiliary electrode and the wiring interval b between auxiliary electrodes. In this case, when the second auxiliary electrodes 410 are formed, the amount by which a shadow mask is shifted can be controlled to be about the size of a single pixel. As a result, after the shadow mask is aligned in the formation of the second auxiliary electrodes 410, the amount of parallel shift of the shadow mask can be reduced. Accordingly, the second auxiliary electrodes 410 can be easily formed at desired positions.

The ratio of the wiring width a of each auxiliary electrode to the area of one pixel corresponds to the width of an element isolation film disposed at the periphery of each pixel. When the pixel size increases, the wiring width a of each auxiliary electrode also increases. In general, when the pixel size increases, the alignment accuracy required for the formation of auxiliary electrodes tends to decrease. By satisfying the formula (3) specifying the relationship between the wiring width a of each auxiliary electrode and the wiring interval b of auxiliary electrodes, the advantages of the present invention can be obtained.

As described above, in the formation of the second auxiliary electrodes 410, it is necessary to use the alignment mark provided on a substrate again. Therefore, the film thickness d of each of the first auxiliary electrodes 400 is 30 nm or less, as specified in formula (2). Furthermore, the film thickness d of each of the first auxiliary electrodes 400 is 5 nm or more in order that the first auxiliary electrodes 400 function as wiring when being arranged on the organic EL substrate having irregularities thereon.

On the other hand, the film thickness of each of the second auxiliary electrodes 410 can be determined such that the resistance of the second electrode 320 including an auxiliary electrode is a desired value. In the display apparatus according to this embodiment of the present invention, the thickness of each of the first auxiliary electrodes 400 is smaller than the thickness of each of the second auxiliary electrodes 410.

The second electrode 320 may be composed of a transparent electroconductive film, although it depends on the type of material of auxiliary electrodes and the type of material of the second electrode 320. In this case, by satisfying the above relationships, the resistance of an area where a first auxiliary electrode 400, which is a thin film, and the second electrode 320 are laminated is about 1/10 of the resistance of an area where only the second electrode 320 is provided.

In addition, in order to prevent degradation of the display substrate due to moisture from the outside, a sealing substrate is bonded onto the substrate 101 using a UV-curable epoxy resin in a nitrogen atmosphere with a dew point of −60° C. or lower. Furthermore, a moisture-absorbing film made of, for example, strontium oxide or calcium oxide may be deposited on a surface of the sealing substrate, the surface being adjacent to organic EL elements. In this embodiment, the substrate 101 is sealed using a glass substrate. Alternatively, the substrate 101 may be sealed using an inorganic insulating film made of silicon nitride, silicon oxynitride, silicon oxide, or the like.

EXAMPLE

Next, an example of a method of producing the display apparatus having the above-described structure and a specific example of a top-emission-type organic EL display apparatus, which has a more specific structure than the above display apparatus, will be described in the order of a production procedure with reference to FIGS. 5A to 7B. FIGS. 5A to 7B are cross-sectional views showing steps of a process of producing an organic EL element in the display apparatus according to an Example of the present invention.

Figure 5A:
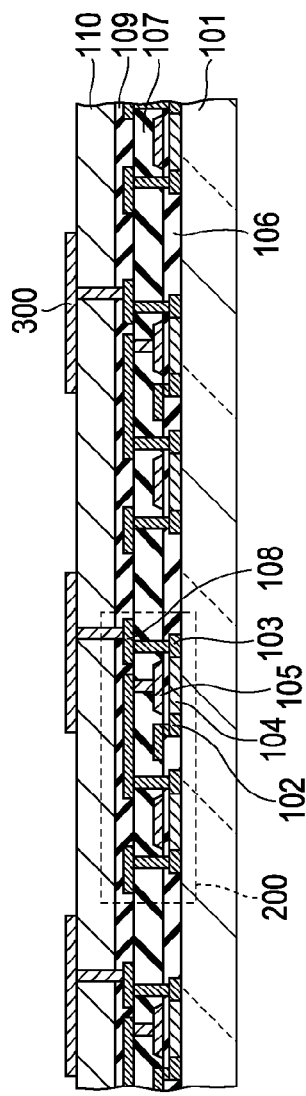
FIGS. 5A to 5C are cross-sectional views showing steps of a process of producing an organic EL element in a display apparatus according to an Example of the present invention.

First, as shown in FIG. 5A, a TFT 200 and source and drain electrodes thereof were formed on a substrate 101 composed of, for example, a glass substrate. Subsequently, in order to planarize irregularities formed on a surface of the substrate 101 by the formation of the TFT 200 and the electrodes, a planarizing film 110 was formed on the substrate 101. In this case, for example, a positive photosensitive polyimide is applied on the substrate 101 by spin coating. Pattern exposure is performed with an exposure apparatus, development is performed with a developing apparatus, and postbaking is then performed.

Next, a first electrode 300 was formed on the planarizing film 110. Here, an aluminum (Al) layer having a thickness of 100 nm was formed as a reflective layer on the planarizing film 110. Subsequently, an electroconductive oxide (e.g., ITO) layer having a thickness of about 20 nm was then deposited by a sputtering method.

Figure 5B:
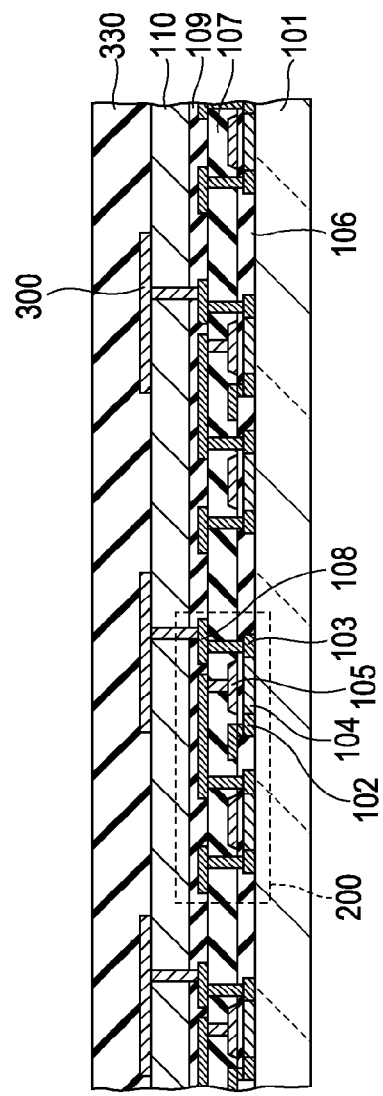
Figure 5C:
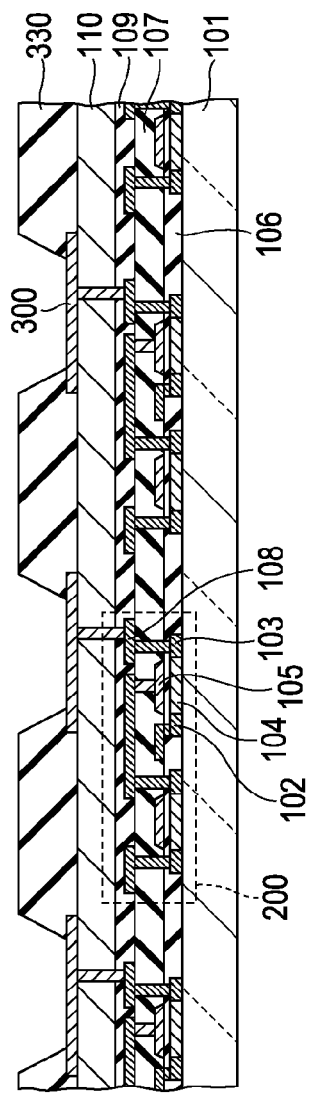

Subsequently, as shown in FIG. 5B, a silicon dioxide ($SiO_2$) film having a thickness of about 300 nm was deposited by, for example, chemical vapor deposition (CVD) to form an element isolation film 330. Subsequently, a resist pattern was formed on the silicon dioxide ($SiO_2$) film using a lithography technique. As shown in FIG. 5C, the silicon dioxide ($SiO_2$) film was then patterned by etching using the resist pattern as a mask. In this step, etching is performed under a condition that etched side walls have a tapered shape.

Figure 6A:
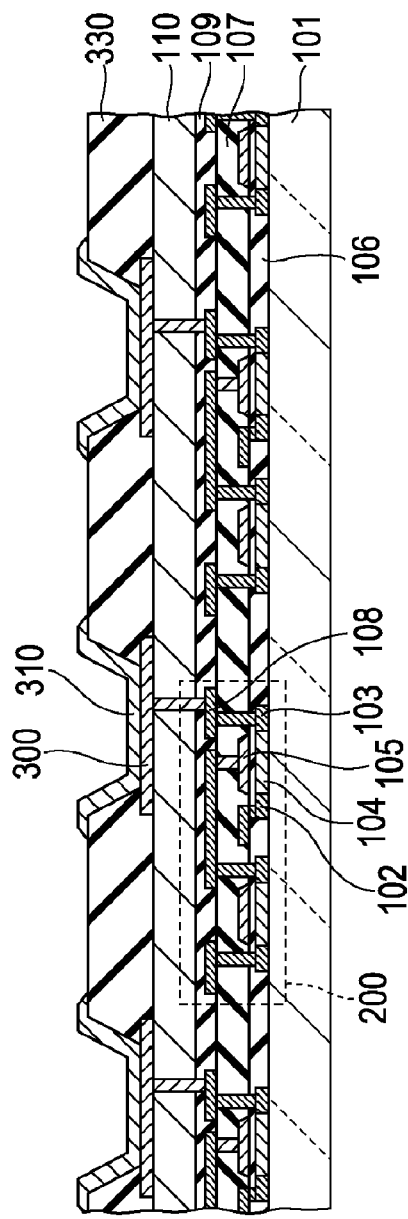
FIGS. 6A and 6B are cross-sectional views showing steps of the process of producing the organic EL element in the display apparatus according to the Example of the present invention.
Figure 6B:
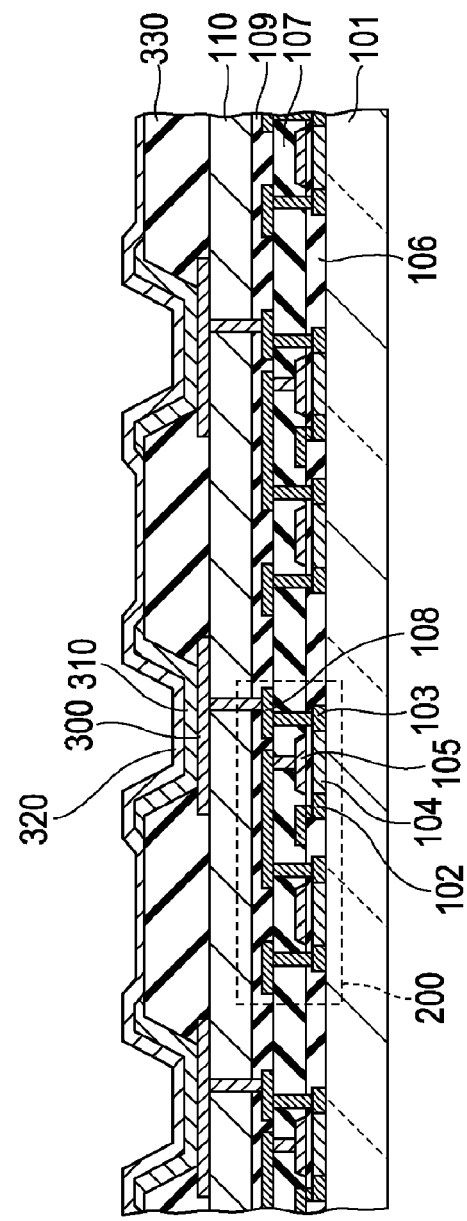

Next, as shown in FIG. 6A, a light-emitting material was deposited by a vapor deposition process using a shadow mask. As shown in FIG. 6B, a second electrode 320 made of an electroconductive material was then formed by a vapor deposition process using a shadow mask.

Next, as shown in FIG. 7A, aluminum (Al) was deposited as a first auxiliary electrode 400 having a thickness of 10 nm using a shadow mask by vapor deposition. The first auxiliary electrode 400 formed by vapor deposition had a wiring width of 15 μm and a wiring interval of 30 μm. The wiring length of the first auxiliary electrode 400 was 200 μm.

Subsequently, by the procedure that has been described with reference to FIGS. 4A to 4D, alignment was performed using an alignment mark of the shadow mask, and the shadow mask was then shifted by 100 μm in a direction parallel to the wiring formed by the first auxiliary electrode 400. A second auxiliary electrode 410 having a thickness of 100 nm was formed by vapor deposition, as shown in FIG. 7B. Thus, second auxiliary electrodes 410 were formed using the shadow mask having the same openings as the first auxiliary electrodes 400.

Finally, a moisture-absorbing material containing strontium oxide as a main component was bonded onto a recessed area of a sealing substrate (not shown), the area not inhibiting display, and the sealing substrate was bonded onto the substrate 101 using a UV-curable epoxy resin in a nitrogen atmosphere with a dew point of −60° C. or lower.

The display apparatus having the structure described with reference to FIGS. 1 and 2 can be produced by the above-described steps. This display apparatus satisfies all formulae (1) to (3) mentioned above.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-263016 filed Oct. 9, 2007, which is hereby incorporated by reference herein in its entirety.

What is claimed is:

1. A display apparatus comprising:
a substrate;
a plurality of light-emitting elements disposed on the substrate,
the light-emitting elements including
a plurality of first electrodes, each of which is independently disposed on the substrate,
a plurality of light-emitting layers, wherein a light-emitting layer is disposed on each of the first electrodes, and
a light-transmissive second electrode which is continuously disposed over the light-emitting layers so as to cover the plurality of light-emitting elements; and
auxiliary electrodes which are disposed on the second electrode and which are linearly arranged between adjacent light-emitting elements,
each of the auxiliary electrodes including
first auxiliary electrodes which are intermittently arranged at intervals and which have a thickness in the range of 5 to 30 nm, and
second auxiliary electrodes which cover edges of the first auxiliary electrodes and which are intermittently arranged at the same intervals as the first auxiliary electrodes.

2. The display apparatus according to claim 1, wherein the thickness of the second auxiliary electrodes is larger than the thickness of the first auxiliary electrodes.

3. A method of producing a display apparatus including a substrate;
a plurality of light-emitting elements disposed on the substrate,
the light-emitting elements including a plurality of first electrodes, each of which is independently disposed on the substrate, a plurality of light-emitting layers, wherein a light-emitting layer is disposed on each of the first electrodes, and a light-transmissive second electrode which is continuously disposed over the light-emitting layers so as to cover the plurality of light-emitting elements; and
auxiliary electrodes which are disposed on the second electrode and which are linearly arranged between adjacent light-emitting elements,
the method comprising the steps of:
aligning the substrate with a shadow mask to form an aligned state by aligning an alignment mark provided on the substrate with an opening provided on the shadow mask;
forming first auxiliary electrodes intermittently at intervals in the aligned state;
aligning the alignment mark on which a layer comprising the first auxiliary electrodes is formed with the opening, and then shifting the shadow mask by a predetermined distance; and
forming second auxiliary electrodes intermittently so as to cover edges of the first auxiliary electrodes.

* * * * *